United States Patent
Tsukiyama et al.

(10) Patent No.: US 10,593,649 B2
(45) Date of Patent: Mar. 17, 2020

(54) SEMICONDUCTOR DEVICE

(71) Applicant: TOSHIBA MEMORY CORPORATION, Minato-ku (JP)

(72) Inventors: Satoshi Tsukiyama, Yokohama (JP); Masaru Koyanagi, Ota (JP); Mikihiko Ito, Ota (JP); Kazushige Kawasaki, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/121,150

(22) Filed: Sep. 4, 2018

(65) Prior Publication Data

US 2019/0295987 A1  Sep. 26, 2019

(30) Foreign Application Priority Data

Mar. 20, 2018  (JP) ................... 2018-053315

(51) Int. Cl.
  *H01L 25/065* (2006.01)
  *H01L 23/48* (2006.01)
  *H01L 23/31* (2006.01)

(52) U.S. Cl.
  CPC ...... *H01L 25/0657* (2013.01); *H01L 23/3128* (2013.01); *H01L 23/481* (2013.01); *H01L 2225/0651* (2013.01); *H01L 2225/06513* (2013.01); *H01L 2225/06541* (2013.01)

(58) Field of Classification Search
  None
  See application file for complete search history.

(56) References Cited

U.S. PATENT DOCUMENTS

| 7,531,905 | B2 * | 5/2009 | Ishino | ............... H01L 24/73 257/686 |
|---|---|---|---|---|
| 8,436,469 | B2 | 5/2013 | Tada et al. | |
| 8,941,246 | B2 | 1/2015 | Miura et al. | |
| 2013/0134583 | A1 | 5/2013 | Tsukiyama et al. | |

FOREIGN PATENT DOCUMENTS

| JP | 4858692 | 1/2012 |
|---|---|---|
| JP | 2013-8963 | 1/2013 |
| JP | 5677489 | 2/2015 |
| JP | 5936968 | 6/2016 |
| JP | 2017-152648 | 8/2017 |

\* cited by examiner

*Primary Examiner* — Long Pham
(74) *Attorney, Agent, or Firm* — Oblon, McClelland, Maier & Neustadt, L.L.P.

(57) ABSTRACT

A semiconductor device includes a base member, a stacked body on the base member, a first conductor on the stacked body, a second conductor on a top surface of the base member, and a connection conductor connecting the first conductor and the second conductor. The stacked body includes semiconductor chips stacked and a shared terminal connected to the plurality of semiconductor chips. The plurality of semiconductor chips each includes a functional element on a front surface side thereof and a through electrode extending from a back surface to the front surface side. The shared terminal has a top end positioned at a top surface of the stacked body and a bottom end positioned at a bottom surface of the stacked body. The first conductor is connected to the top end of the shared terminal, and the second conductor is electrically connected to the bottom end of the shared terminal.

15 Claims, 5 Drawing Sheets

US 10,593,649 B2

SEMICONDUCTOR DEVICE

CROSS-REFERENCE TO RELATED APPLICATIONS

This application is based upon and claims the benefit of priority from Japanese Patent Application No. 2018-053315, filed on Mar. 20, 2018; the entire contents of which are incorporated herein by reference.

FIELD

Embodiments relate to a semiconductor device.

BACKGROUND

A semiconductor device is known, which includes a resin-sealed stacked body of semiconductor chips on a substrate. In such a semiconductor device, it is difficult to supply a uniform voltage to each semiconductor chip when the number of stacked semiconductor chips increases.

DETAILED DESCRIPTION

Figure 1:
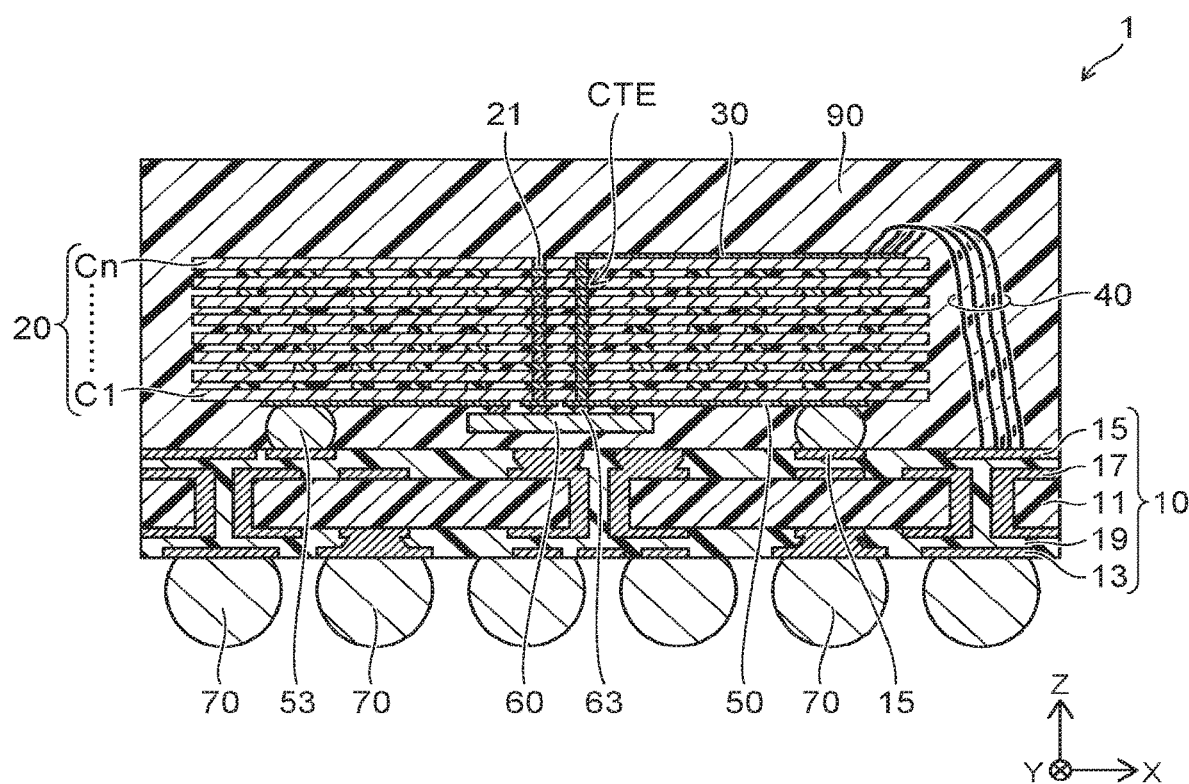
FIG. 1 is a schematic sectional view showing a semiconductor device according to an embodiment.

According to one embodiment, a semiconductor device includes a base member, a stacked body placed on the base member, a first conductor provided on a top surface of the stacked body, a second conductor provided on the top surface of the base member, and a connection conductor connecting the first conductor and the second conductor. The stacked body includes a plurality of semiconductor chips and a shared terminal. The plurality of semiconductor chips are stacked in a direction crossing a top surface of the base member. The shared terminal is connected to the plurality of semiconductor chips. The plurality of semiconductor chips each have a front surface and a back surface opposite to the front surface. The plurality of semiconductor chips each includes a functional element placed on a front surface side thereof and a through electrode extending from the back surface to the front surface side. The shared terminal includes the through electrode, and has a top end positioned at the top surface of the stacked body and a bottom end positioned at a bottom surface of the stacked body. The first conductor is connected to the top end of the shared terminal, and the second conductor is electrically connected to the bottom end of the shared terminal.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic sectional view showing a semiconductor device 1 according to an embodiment. The semiconductor device 1 includes a base member 10, a stacked body 20, a first conductor 30, and a connection conductor (hereinafter referred to as a connection wire 40). The stacked body 20 is placed on the base member 10, and includes a plurality of semiconductor chips C1-Cn. The stacked body 20 is molded on the base member 10 using a resin member 90.

The semiconductor chips C1-Cn are stacked in a direction crossing the upper surface of the base member 10. The first conductor 30 is provided on the stacked body 20. The base member 10 includes a second conductor (hereinafter referred to as an interconnect 15) provided on the upper surface thereof. The connection wire 40 connects the first conductor 30 and the interconnect 15.

The semiconductor chips C1-Cn each include a through electrode (through silicon via) 21. The through electrode 21 is so-called a via-contact extending from the back surface to the element surface in each semiconductor chip. The stacked body 20 includes a shared terminal CTE including through electrodes 21 of the semiconductor chips C1-Cn. The shared terminal CTE is electrically connected to each semiconductor chip.

The shared terminal CTE has a bottom end positioned at the bottom surface of the lowermost semiconductor chip C1 of the semiconductor chips C1-Cn and a top end positioned at the top surface of the uppermost semiconductor chip Cn of the semiconductor chips C1-Cn. The first conductor 30 is connected to the top end of the shared terminal CTE. The interconnect 15 is electrically connected to the first conductor 30 via the connection wire 40, and is also electrically connected to the bottom end of the shared terminal CTE.

The semiconductor device 1 further includes e.g. an interconnect 50 provided on the bottom surface of the stacked body 20, and a connection bump 53. The interconnect 50 is connected to the bottom end of the shared terminal CTE. The connection bump 53 contains e.g. a solder material, and connects the stacked body 20 to the base member 10. For instance, the connection bump 53 is placed in contact with the interconnect 15 and the interconnect 50. Thus, the interconnect 15 is electrically connected to the bottom end of the shared terminal CTE through the connection bump 53 and the interconnect 50.

The base member 10 is e.g. a package substrate, and includes a core member 11, a contact pad 13, the interconnect 15, an internal interconnect 17, and an interlayer insulating film 19. The core member 11 and the interlayer insulating film 19 contain e.g. resin. The contact pad 13 is provided on the bottom surface of the base member 10. The interconnect 15 is provided on the top surface of the base member 10. The contact pad 13 is electrically connected to the interconnect 15 through e.g. the internal interconnect 17.

The semiconductor device 1 further includes e.g. a plurality of connection members 70 placed on the bottom surface of the base member 10. The connection member 70 connects e.g. the semiconductor device 1 to a circuit substrate. The connection member 70 is e.g. a solder bump and electrically connects an external circuit and the semiconductor device 1. The connection member 70 is in contact with the contact pad 13 and electrically connected to the interconnect 15. One of the connection members 70 is a power supply terminal connected to a power supply line of the external circuit.

The shared terminal CTE is e.g. a power supply terminal of the stacked body 20. The shared terminal CTE is electrically connected to an external power supply through the interconnect 50, the connection bump 53, and the interconnect 15. Furthermore, the shared terminal CTE is connected to the same external power supply through the first conductor 30, the connection wire 40, and the interconnect 15. That is, the semiconductor chips C1-Cn included in the stacked body 20 are supplied with voltage from the external power supply that is connected to both the top end and the bottom end of the shared terminal CTE. Thus, in the semiconductor device 1, the voltage drop due to the internal resistance of the shared terminal CTE can be reduced to supply voltage within the prescribed range to the semiconductor chips C1-Cn. That is, even for a larger number of stacked semiconductor chips C1-Cn, it is possible to avoid the voltage supply outside the prescribed range to each semiconductor chip by reducing the voltage drop inside the stacked body 20.

The semiconductor device 1 further includes a logic chip 60. The logic chip 60 is placed e.g. between the base member 10 and the stacked body 20 and connected to the interconnect 50 through a flip-chip bump (hereinafter referred to as a FC bump 63). For instance, the semiconductor device 1 may be configured so as to supply a power supply voltage to both the stacked body 20 and the logic chip 60 through the interconnect 50. The logic chip 60 is electrically connected to the stacked body 20 and the external circuit through another interconnect 50 and configured to transmit and receive e.g. commands and data signals.

Figure 2:
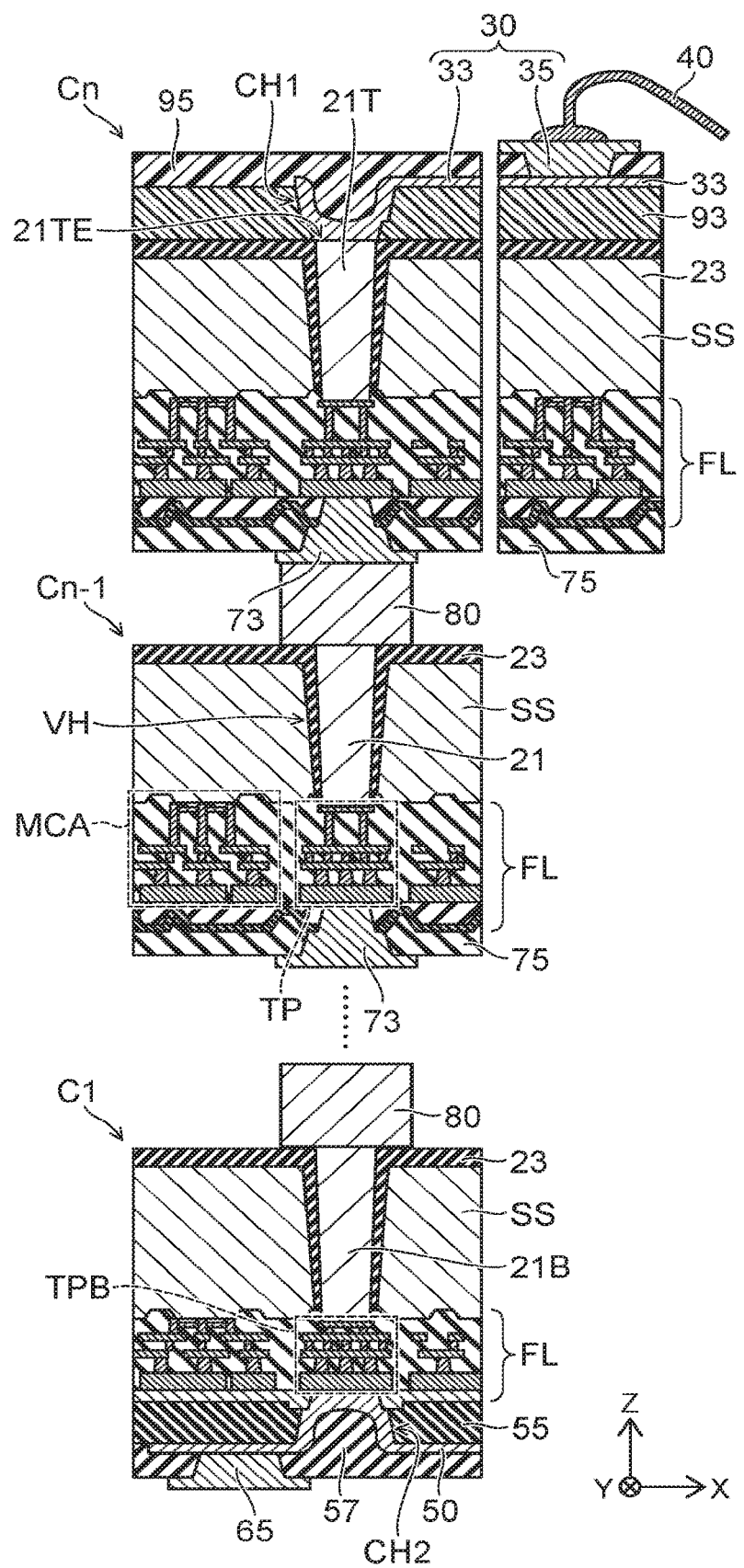
FIG. 2 is a partial sectional view schematically showing the semiconductor device according to the embodiment.

FIG. 2 is a partial sectional view schematically showing the semiconductor device 1 according to the embodiment. FIG. 2 is a schematic sectional view illustrating the shared terminal CTE. In FIG. 2, the semiconductor chips C1, Cn-1, and Cn are depicted, omitting the semiconductor chips C2-Cn-2 located between the semiconductor chip C1 and the semiconductor chip Cn-1. The semiconductor chips C2-Cn-2 each have the same structure as the semiconductor chip Cn-1.

As shown in FIG. 2, each semiconductor chip includes a semiconductor substrate SS and a functional layer FL. The semiconductor substrate SS is e.g. a silicon substrate. The functional layer FL includes e.g. a memory cell array MCA and a terminal part TP. The semiconductor device 1 is e.g. a NAND-type nonvolatile memory device. The memory cell array MCA includes a plurality of memory cells that are arranged in three-dimensions.

The semiconductor chips C1-Cn each include a through electrode 21. The through electrode 21 is provided inside a via hole VH extending from the back surface of the semiconductor substrate SS to the element surface provided with the functional layer FL. The through electrode 21 is electrically isolated from the semiconductor substrate SS by an insulating film 23. The insulating film 23 is provided so as to cover the back surface of the semiconductor substrate SS and the inner wall of the via hole VH. The through electrode 21 has one end connected to the terminal part TP of the functional layer FL and the other end connected to a microbump 80 provided on the back surface of the semiconductor substrate SS.

The semiconductor chips C1-Cn each further include a microbump 73. The micro-bump 73 is provided so as to extend through an insulating film 75 that covers the functional layer FL. The micro-bump 73 is electrically connected to the terminal part TP.

The semiconductor chips C1-Cn are electrically connected to each other through the micro-bump 80. The micro-bump 80 is connected to the microbump 73 of the semiconductor chip placed directly above. The microbump 80 electrically connects the through electrode 21 located directly below and the terminal part TP located directly above. The shared terminal CTE (see FIG. 1) includes the terminal part TP, the through electrode 21, and the microbumps 73 and 80 of the respective semiconductor chips C1-Cn.

The first conductor 30 is provided on the semiconductor chip Cn positioned at the uppermost level of the semiconductor chips C1-Cn. The first conductor 30 includes an interconnect 33 and a microbump 35.

The interconnect 33 is provided on an insulating film 93 provided on the back surface of the semiconductor substrate SS. The interconnect 33 extends in a contact hole CH1 provided in the insulating film 93. The interconnect 33 is provided to be in contact with the through electrode 21T. The top end 21TE of the through electrode 21T is exposed at the bottom surface of the contact hole CH1, and is in contact with the portion of the interconnect 33 extending along the inner surface of the contact hole CH1. The top end 21TE of the through electrode 21T in the semiconductor chip Cn is also the top end of the shared terminal CTE.

The microbump 35 extends through an insulating film 95 that covers the interconnect 33, and is connected to the interconnect 33. The connection wire 40 is bonded to the microbump 35.

The interconnect 50 is provided on the bottom surface of the semiconductor chip C1 positioned at the lowermost level of the semiconductor chips C1-Cn. The interconnect 50 is provided on an insulating film 55 provided on the functional layer FL. The interconnect 50 is connected to the terminal part TPB through a contact hole CH2 provided in the insulating film 55. The terminal part TPB is exposed at the bottom surface of the contact hole CH2, and is in contact with the portion of the interconnect 50 extending in the contact hole CH2. The terminal part TPB of the semiconductor chip C1 is positioned at the bottom end of the shared terminal CTE.

Furthermore, an insulating film 57 covering the interconnect 50 and a microbump 65 are provided. The micro-bump 65 extends through the insulating film 57 and is connected to the interconnect 50.

For instance, as shown in FIG. 1, the interconnect 50 is electrically connected to the interconnect 15 through the connection bump 53. As shown in FIG. 2, the interconnect 50 is connected to the terminal part TPB of the semiconductor chip C1. The logic chip 60 is connected to the microbump 65 through the FC bump 63. Furthermore, the logic chip 60 is electrically connected to the interconnect 50 through the microbump 65.

Figure 3:
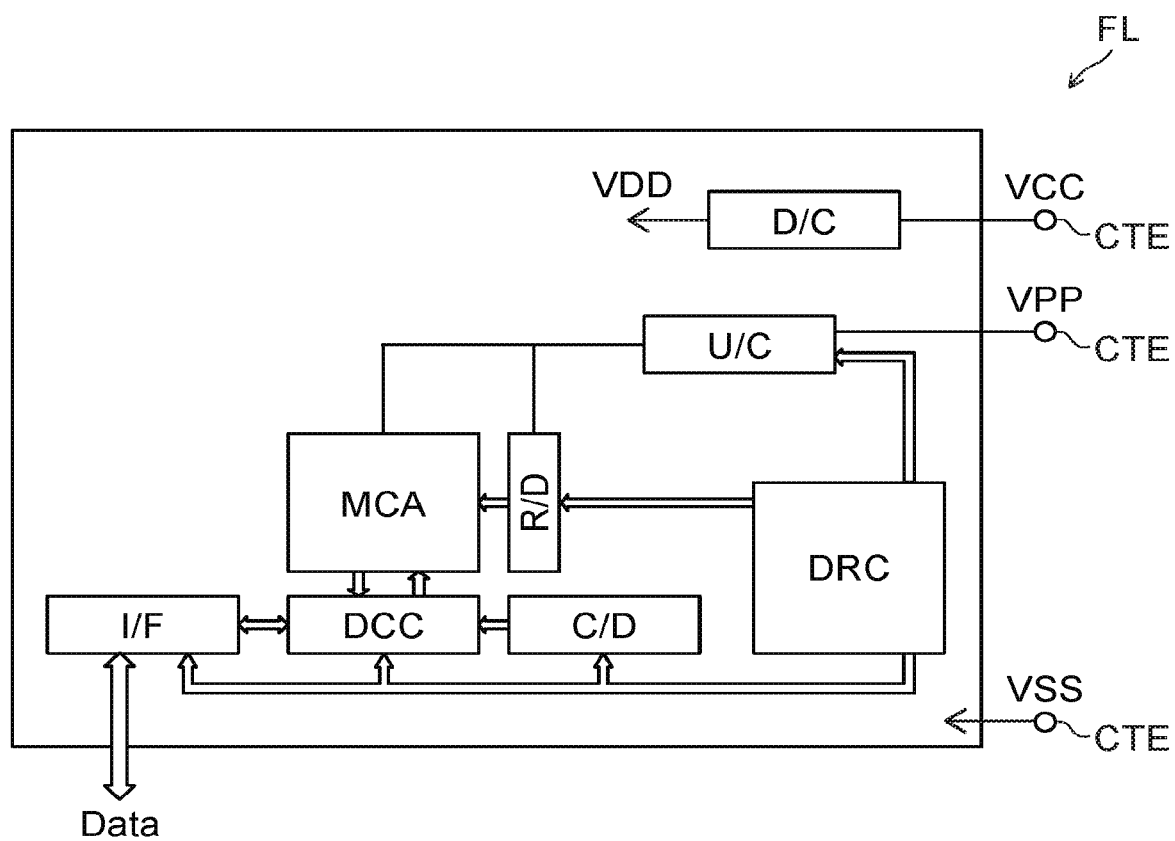
FIG. 3 is a block diagram showing the semiconductor device according to the embodiment.

FIG. 3 is a block diagram showing the semiconductor device 1 according to the embodiment. FIG. 3 is a block diagram schematically showing a configuration of the functional layer FL in the semiconductor chips C1-Cn. The functional layer FL is e.g. a NAND-type memory element, and includes a memory cell array MCA and a control circuit DRC.

The memory cell array MCA includes e.g. a plurality of memory cells arranged in three dimensions. The control circuit DRC drives the memory cell array MCA through e.g. a row decoder R/D, a column decoder C/D, a data control circuit DCC, an interface circuit I/F, and a step-up circuit U/C. The interface circuit IF is connected to the logic chip 60 through e.g. an interconnect (not shown), and performs commands and data transmission.

The functional layer FL is supplied with e.g. a plurality of different voltages through a plurality of shared terminals CTE. For instance, the source voltage VCC is supplied to a step-down circuit D/C through one of the shared terminals CTE. The step-down circuit D/C supplies an internal voltage VDD to each circuit block in the functional layer FL. A stepped-up voltage VPP is supplied to the step-up circuit U/C through another shared terminal CTE. The step-up circuit U/C supplies e.g. an erasure voltage VER to the memory cell array MCA and a program voltage VPG to the row decoder R/D. Furthermore, a ground voltage VSS is supplied to each block circuit through yet another shared terminal CTE.

As described above, the stacked body 20 includes a plurality of shared terminals CTE. Thus, a plurality of first conductors 30 are placed on the top surface of the stacked body 20. The top ends of the plurality of shared terminals CTE are connected to the first conductors 30, respectively. A plurality of interconnects 15 are connected via a plurality of connection wires 40 to the first conductor 30, respectively. A plurality of different voltages are supplied from the plurality of interconnects 15 to the plurality of shared terminals CTE, respectively, through the connection wires 40 and the first conductors 30.

The connection conductor according to the embodiment is not limited to the connection wire 40. The connection conductor is provided outside the stacked body 20 to electrically connect the interconnect 15 to the first conductor 30 provided on the top surface of the stacked body 20. TAB (taped automated bonding) or VCI (vertical circuit interconnection) may be used for such a connection conductor.

A method for manufacturing the semiconductor device 1 according to the embodiment is described with reference to FIGS. 4A to 5C. FIGS. 4A to 5C are schematic sectional views showing the manufacturing processes of the semiconductor chips C1-Cn.

Figure 4A:
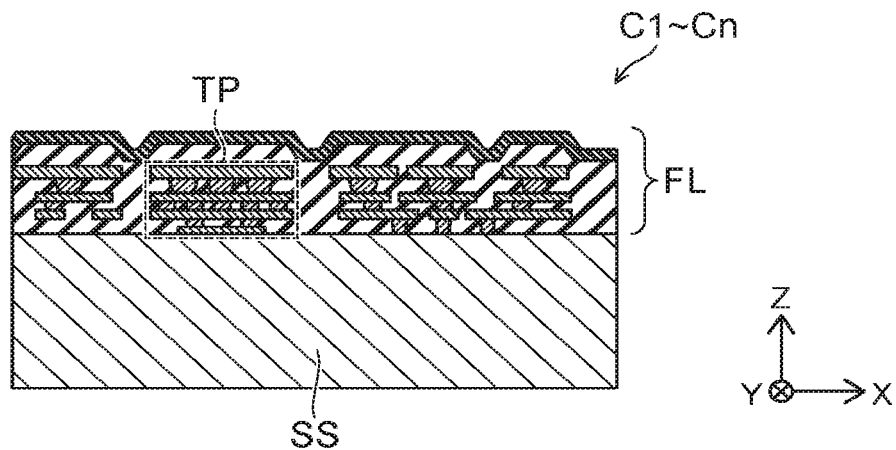
FIGS. 4A to 5C are schematic sectional views showing manufacturing processes of the semiconductor device according to the embodiment.

FIG. 4A is a schematic view showing a process common to the semiconductor chips C1-Cn. As shown in FIG. 4A, a functional layer FL is formed on a semiconductor substrate SS. The semiconductor substrate SS is e.g. a silicon substrate. The functional layer FL is e.g. a NAND-type memory element and includes a terminal part TP. The terminal part TP includes a terminal connecting the NAND-type memory element to an external circuit.

Figure 4B:
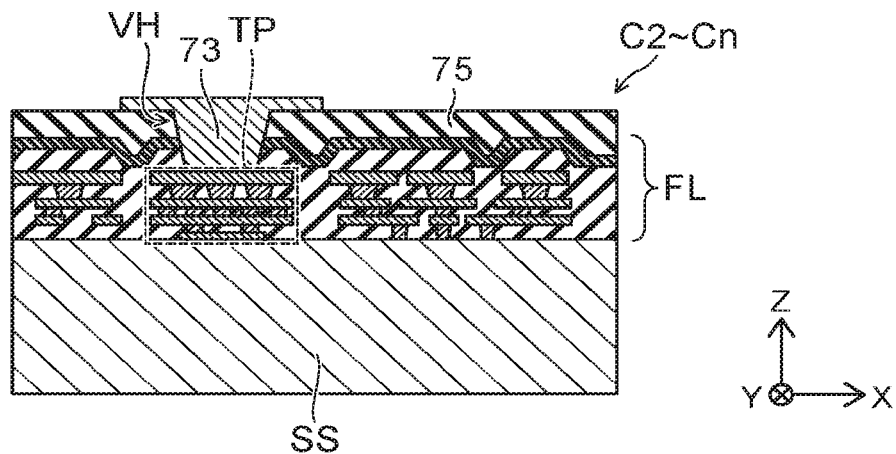

FIG. 4B is a schematic view showing a process common to the semiconductor chips C2-Cn. As shown in FIG. 4B, an insulating film 75 is formed on the functional layer FL. Then, a contact hole CHF is formed in the insulating film 75. The insulating film 75 is e.g. a silicon oxide film.

Subsequently, a microbump 73 is formed on the functional layer FL. The microbump 73 is formed inside the contact hole CHF so as to be in contact with the terminal part TP. The microbump 73 contains e.g. metal such as nickel, copper, gold, and solder.

Figure 4C:
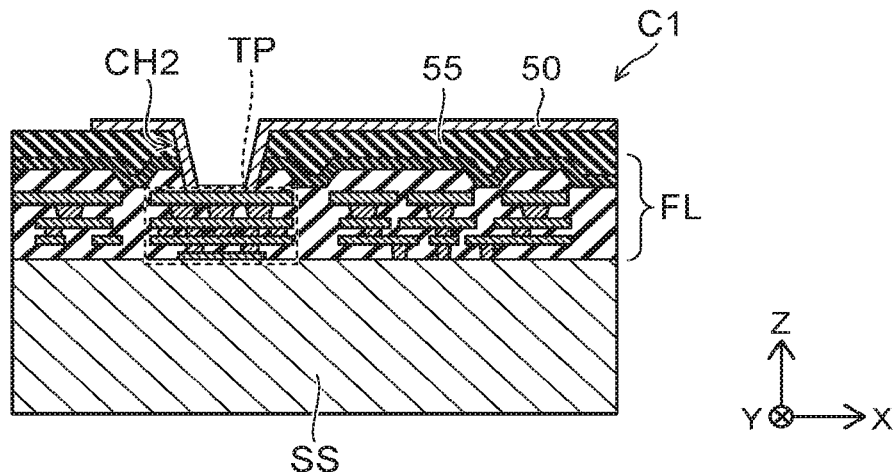

FIG. 4C is a schematic view showing a process for manufacturing the semiconductor chip C1. As shown in FIG. 4C, an insulating film 55 is formed on the functional layer FL. Then, a contact hole CH2 is formed in the insulating film 55. The insulating film 55 is e.g. a silicon oxide film.

Subsequently, an interconnect 50 is formed on the insulating film 55. The interconnect 50 is formed so as to have a portion extending in the contact hole CH2, and to be in contact with the terminal part TPB. The interconnect 50 is e.g. a metal interconnect containing e.g. tungsten, copper, or aluminum.

Figure 5A:
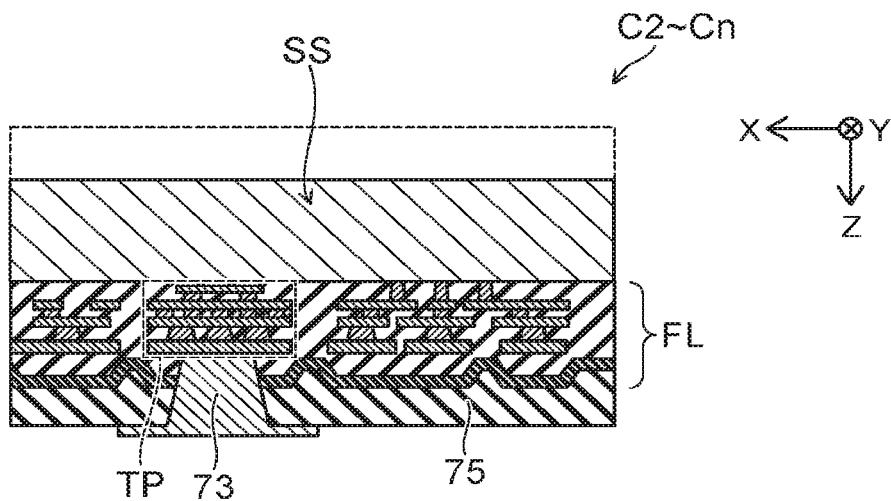

FIG. 5A is a schematic view showing a process common to the semiconductor chips C2-Cn. As shown in FIG. 5A, the semiconductor substrate SS is thinned by grinding or polishing the back surface of the semiconductor substrate SS. The semiconductor substrate SS is thinned to a thickness of e.g. approximately 20 micrometers (μm).

Figure 5B:
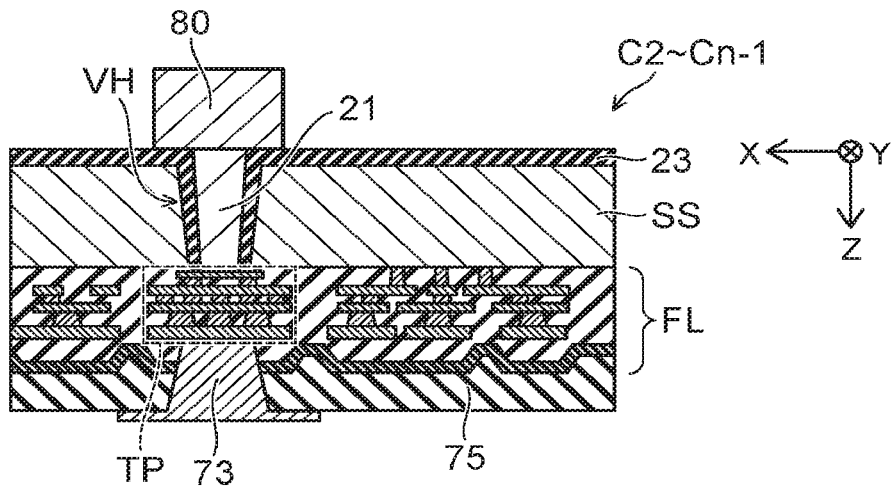

FIG. 5B is a schematic view showing a process common to the semiconductor chips C2-Cn-1. As shown in FIG. 5B, a via hole VH is formed to communicate from the back surface of the semiconductor substrate SS to the terminal part TP. Then, an insulating film 23 is formed to cover the inner wall of the via hole VH and the back surface of the semiconductor substrate SS. The insulating film 23 is formed such that the terminal part TP is exposed at the bottom surface of the via hole VH. The insulating film 23 is e.g. a silicon oxide film.

Subsequently, a through electrode 21 is formed inside the via hole VH. The through electrode 21 is formed so as to be in contact with the terminal part TP at the bottom surface of the via hole VH. The through electrode 21 is electrically isolated from the semiconductor substrate SS by the insulating film 23. The through electrode 21 contains e.g. metal such as tungsten, nickel, copper, and solder, and has a size of 3-50 μm in diameter.

Furthermore, a microbump 80 is formed on the through electrode 21. The microbump 80 is formed on the back surface of the semiconductor substrate SS via the insulating film 23. The microbump 80 is in contact with the through electrode 21. The microbump 80 is electrically isolated from the semiconductor substrate SS by the insulating film 23. The microbump 80 contains e.g. metal such as nickel, copper, gold, and solder. The microbump 80 has a size of 5-50 μm in diameter.

The processes shown in FIGS. 5A and 5B are applied also to the semiconductor chip C1. That is, after forming the interconnect 50 shown in FIG. 4C, the semiconductor substrate SS is thinned. Then, the through electrode 21B is formed to be connected to the terminal part TPB, and the micro-bump 80 is formed on an end of the through electrode (see FIG. 2).

Figure 5C:
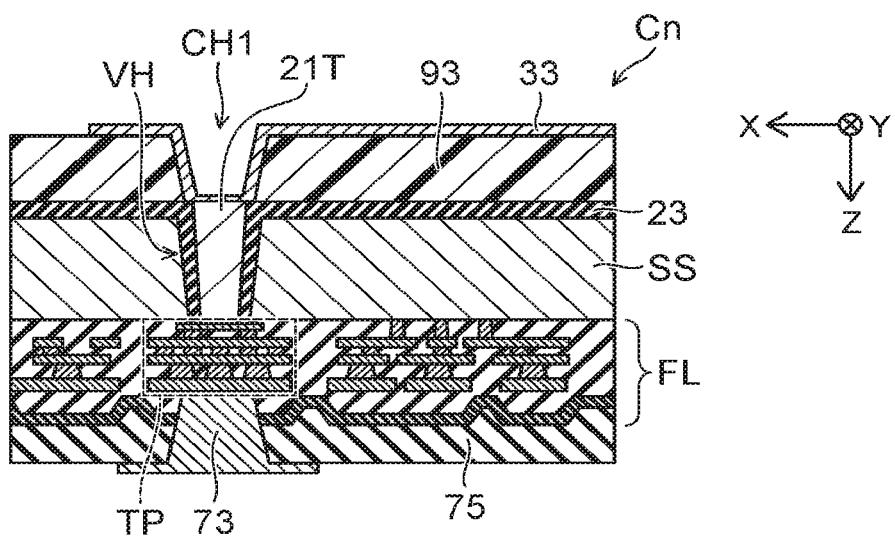

FIG. 5C is a schematic view showing a process for manufacturing the semiconductor chip Cn. As shown in FIG. 5C, after thinning the semiconductor substrate SS and forming a via hole VH, a through electrode 21T is formed inside the via hole VH. The through electrode 21T is in contact with the terminal part TP of the functional layer FL. The through electrode 21T is electrically isolated from the semiconductor substrate SS by the insulating film 23.

Subsequently, an insulating film 93 is formed on the back surface of the semiconductor substrate SS. The insulating film 93 contains e.g. resin such as polyimide. Subsequently, a contact hole CH2 is formed so as to be in communication with the through electrode 21T. Then, an interconnect 33 is formed on the insulating film 93. The interconnect 33 is formed so as to have a portion extending in the contact hole CH1 and to be in contact with the through electrode 21T. The interconnect 33 is e.g. a metal interconnect containing e.g. nickel, copper, aluminum, or gold.

Furthermore, an insulating film 95 is formed to cover the interconnect 33 and the insulating film 93. Then, a microbump 35 is formed to contact the interconnect 33 (see FIG. 2). The insulating film 95 contains e.g. resin such as polyimide. The microbump 35 contains e.g. nickel, copper, aluminum, or gold.

The stacked body 20 is formed by e.g. sequential flip-chip bonding of the semiconductor chips C1-Cn via the microbumps 80 (see FIG. 1). The microbumps 80 are arranged with a pitch of e.g. 10-100 µm on the back surface of the semiconductor substrate SS.

A plurality of through electrodes 21 are provided other than that included in the shared terminal CTE, and connect the circuits included in the functional layers FL of the respective semiconductor chips to each other. The through electrodes 21 are arranged with a pitch of e.g. 10-100 µm along the back surface of the semiconductor substrate SS. The microbumps 73 and 80 have a size of e.g. 50-200 µm in diameter. The microbumps 73 and 80 are arranged with a pitch of 100-500 µm on the back surface of the semiconductor substrate SS.

Furthermore, a logic chip 60 is flip-chip bonded to the bottom surface of the stacked body 20. Then, the stacked body 20 is bonded to a base member 10 via connection bumps 53. Subsequently, a connection wire 40 is bonded to the interconnect 15 and the first conductor 30. Then, the stacked body 20, the logic chip 60, and the connection wire 40 are resin-sealed. The connection wire 40 contains e.g. metal such as gold, aluminum, and silver.

The above examples are illustratively described, and the embodiment is not limited thereto. For instance, the semiconductor chips C1-Cp (p<n) included in the stacked body 20 may be supplied with external voltage from the bottom end of the shared terminal CTE, and the semiconductor chips Cp+1-Cn may be supplied with the external voltage from the top end of the shared terminal CTE through the connection wire 40. For instance, the upper half of the plurality of semiconductor chips included in the stacked body 20 may be supplied with voltage from the top end of the shared terminal CTE, and the lower half of the semiconductor chips may be supplied with voltage from the bottom end of the shared terminal CTE. In this case, the shared terminal CTE includes a portion provided in the upper half of the stacked body 20 and a portion provided in the lower half of the stacked body 20 electrically separated from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a base member;
   a stacked body placed on the base member, the stacked body including a plurality of memory chips and a shared terminal, the plurality of memory chips being stacked in a direction crossing a top surface of the base member, the shared terminal being connected to the plurality of memory chips and extending in the direction the plurality of memory chips being stacked;
   a first conductor provided on a top surface of the stacked body, the first conductor being provided on a back surface of an uppermost memory chip of the plurality of memory chips;
   a second conductor provided on the top surface of the base member, the second conductor being electrically connected to a front surface of a lowermost memory chip of the plurality of memory chips; and
   a connection conductor connecting the first conductor and the second conductor,
   the stacked body further including an insulating film provided on the back surface of the uppermost memory chip, the first conductor being connected to the shared terminal through a contact hole provided in the insulating film,
   the shared terminal having a top end positioned at the top surface of the stacked body and a bottom end positioned at a bottom surface of the stacked body,
   the first conductor being connected to a top end of the shared terminal, the second conductor being electrically connected to a bottom end of the shared terminal.

2. The device according to claim 1, wherein
   the plurality of memory chips each include a memory cell array including a plurality of memory cells, a terminal part connected to the memory cell array, and a through electrode connected to the terminal part,
   the memory cell array and the terminal part being placed on a front surface side of each memory chip, the through electrode extending from a back surface of each memory chip to the terminal part.

3. The device according to claim 2, wherein
   the stacked body includes a first memory chip, a second memory chip adjacent to the first memory chip in the direction the plurality of memory chips being stacked, and a connection bump connecting the first memory chip and the second memory chip,
   the connection bump connecting a through electrode of the first memory chip and a terminal part of the second memory chip.

4. The device according to claim 3, wherein the shared terminal includes the through electrode, the terminal part, and the connection bump.

5. The device according to claim 2, wherein
   the plurality of memory chips each include a semiconductor substrate,
   the memory cell array and the terminal part are provided on a front surface of the semiconductor substrate, and
   the through electrode extends from a back surface of the semiconductor substrate to the front surface.

6. The device according to claim 5, wherein the plurality of memory chips further include an insulating film electrically insulating the through electrode from the semiconductor substrate.

7. The device according to claim 1, wherein
   the first conductor includes an interconnect connected to the shared terminal and a bonding bump connected to the interconnect, and
   the connection conductor is a metal wire connected to the bonding bump.

8. The device according to claim 1, further comprising:
   a logic chip placed between the stacked body and the base member, the logic chip being connected to the plurality of memory chips,
   wherein the second conductor is connected to the shared terminal and the logic chip.

9. A semiconductor device comprising:
   a base member;

a stacked body placed on the base member, the stacked body including a plurality of memory chips and a shared terminal, the plurality of memory chips being stacked in a direction crossing a top surface of the base member, the shared terminal being connected to the plurality of memory chips and extending in the direction the plurality of memory chips being stacked;

a first conductor provided on a top surface of the stacked body;

a second conductor provided on the top surface of the base member;

a connection conductor connecting the first conductor and the second conductor; and a logic chip placed between the stacked body and the base member, the logic chip being connected to the plurality of memory chips, the second conductor being connected to the shared terminal and the logic chip, the shared terminal having a top end positioned at the top surface of the stacked body and a bottom end positioned at a bottom surface of the stacked body, the first conductor being connected to a top end of the shared terminal, and the second conductor being electrically connected to a bottom end of the shared terminal.

10. The device according to claim 9, wherein
the plurality of memory chips each include a memory cell array including a plurality of memory cells, a terminal part connected to the memory cell array, and a through electrode connected to the terminal part,
the memory cell array and the terminal part being placed on a front surface side of each memory chip, the through electrode extending from a back surface of each memory chip to the terminal part.

11. The device according to claim 10, wherein
the stacked body includes a first memory chip, a second memory chip adjacent to the first memory chip in the direction the plurality of memory chips being stacked, and a connection bump connecting the first memory chip and the second memory chip,
the connection bump connecting a through electrode of the first memory chip and a terminal part of the second memory chip.

12. The device according to claim 11, wherein the shared terminal includes the through electrode, the terminal part, and the connection bump.

13. The device according to claim 10, wherein
the plurality of memory chips each include a semiconductor substrate,
the memory cell array and the terminal part are provided on a front surface of the semiconductor substrate, and
the through electrode extends from a back surface of the semiconductor substrate to the front surface.

14. The device according to claim 13, wherein the plurality of memory chips further include an insulating film electrically insulating the through electrode from the semiconductor substrate.

15. The device according to claim 9, wherein
the first conductor includes an interconnect connected to the shared terminal and a bonding bump connected to the interconnect, and
the connection conductor is a metal wire connected to the bonding bump.

* * * * *